(12) United States Patent
Xia

(10) Patent No.: US 8,473,889 B2
(45) Date of Patent: Jun. 25, 2013

(54) ROUTING STORAGE STRUCTURE BASED ON DIRECTIONAL GRID POINTS AND ROUTING METHOD THEREOF

(75) Inventor: Ji-Yun Xia, Jiangsu (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 13/342,102

(22) Filed: Jan. 1, 2012

(65) Prior Publication Data
US 2013/0104094 A1    Apr. 25, 2013

(30) Foreign Application Priority Data
Oct. 20, 2011    (CN) .......................... 2011 1 0320434

(51) Int. Cl.
*G06F 17/50*    (2006.01)
(52) U.S. Cl.
USPC .......................................... 716/126

(58) Field of Classification Search
USPC ................................................... 716/100, 126
See application file for complete search history.

(56) References Cited

U.S. PATENT DOCUMENTS

| | | | |
|---|---|---|---|
| 7,069,530 B1 * | 6/2006 | Teig et al. ...................... | 716/129 |
| 7,096,449 B1 * | 8/2006 | Teig et al. ...................... | 716/129 |
| 2007/0234259 A1 * | 10/2007 | Drumm et al. ................... | 716/9 |
| 2010/0211312 A1 * | 8/2010 | Ginsberg ....................... | 701/209 |

\* cited by examiner

*Primary Examiner* — Suchin Parihar
(74) *Attorney, Agent, or Firm* — CKC & Partners Co., Ltd.

(57) ABSTRACT

The present invention provides a routing storage structure based on directional grid points and a routing method thereof. The routing storage structure includes a grid matrix having N×M grid points for storing a grid identifier corresponding to each grid point, where both N and M are natural numbers; a grid value acquisition module for acquiring the grid identifier corresponding to the current grid point from the grid matrix during a routing operation; and a grid value setting module for setting the grid points contained by the blocks in the routing plane and/or the grid points that the routing passes through as corresponding grid identifiers in accordance with a predetermined setting rule.

13 Claims, 4 Drawing Sheets

ROUTING STORAGE STRUCTURE BASED ON DIRECTIONAL GRID POINTS AND ROUTING METHOD THEREOF

RELATED APPLICATIONS

This application claims priority to Chinese Application Serial Number 201110320434.6, filed Oct. 20, 2011, which is herein incorporated by reference.

BACKGROUND

1. Field of Invention

The present invention relates to PCB automatic routing technology. More particularly, the present invention relates to a routing storage structure based on directional grid points and a routing method thereof.

2. Description of Related Art

PLCs (Programmable Logic Controllers) have been widely applied in the industrial automation field in recent times. The user writes a logic control program using PLC programming software, compiles the software and then loads the software to the PLC, thereby realizing customized control requirements of the user. Generally, the PLC development environment provides many programming languages, such as IL (Instruction List), ST (Structured Text), LD (Ladder Diagram), FBD (Function Block Diagram), SFC (Sequential Function Chart) and CFC (Continuous Function Chart).

The CFC programming language has been widely accepted because of its characteristics of flexibility, intuitiveness and simplicity. With a CFC programming language module, when the user creates a program window, i.e., a routing plane, the user can add, delete, and move function blocks to operate the blocks of the automatic routing system. When the user performs the operation of connection from one instruction pin to another instruction pin, the connecting path between the two points has been performed by the automatic routing module. In the prior art, the routing algorithm typically employs a maze algorithm, a line-exploring method or an improved algorithm based on the two algorithms, but the routing storage structure of all these algorithms needs storing a block set. That is, the routed route and the block are respectively stored in the line linked list and the block linked list by means of a linked list storage. All the routed lines are recorded in the line linked list, and each line is indicated by a point linked list composed of the inflection points of the line. The position and size information of all the blocks in the routing plane are recorded in the block linked list.

However, according to the storage structure of the routing system in the prior art, if it is assumed that it is requested to accomplish the automatic routing from point A to point B, and that the line linked list includes n nodes, each line has m inflection points on average, and the block linked list includes k nodes, in order to accomplish the automatic routing from point A to point B by the routing algorithm, it is necessary to determine whether L grid points belong to the block set. That is, the maximum traversal times N of the linked list nodes are represented as L×k×n×m, so that the traversal times N are in positive correlation with the complexity of the block set (i.e., the node quantity of the block linked list), and further the routing speed is in negative correlation with the complexity of the block set. Furthermore, with the increase of the complexity of the block set, the storage space occupied by the storage structure increases rapidly, thereby resulting in an abrupt drop in the routing efficiency.

In view of the above, many in the industry are endeavoring to design a more efficient routing storage structure, so as to reduce or eliminate the impact of the complexity of the block set on the automatic routing algorithm and to reduce by as much as possible the storage space occupied by the storage structure, thereby improving the routing efficiency.

SUMMARY

Directed at the disadvantages in routing of the automatic routing system of the prior art, the present invention provides a routing storage structure based on directional grid points and a routing method thereof.

An aspect of the present invention provides a routing storage structure based on directional grid points, which includes:

a grid matrix having N×M grid points for storing a grid identifier corresponding to each grid point, where both N and M are natural numbers;

a grid value acquisition module, for acquiring the grid identifier corresponding to the current grid point from the grid matrix during a routing operation; and a grid value setting module, for setting the grid points contained by the blocks in the routing plane and/or the grid points that the routing passes through as corresponding grid identifiers in accordance with a predetermined setting rule.

In some embodiments, the routing storage structure further includes a determining module for determining whether the routing is able to pass through the current grid point according to the grid identifier corresponding to the current grid point.

In some embodiments, the grid matrix includes n×m sub-matrixes, and each sub-matrix corresponds to k×k grid points, where n, m and k are natural numbers.

In some embodiments, the routing storage structure further includes an update module for updating the grid matrix according to the grid identifier set by the grid value setting module.

In some embodiments, any route in the routing plane is formed by plural grid points connected in sequence and the route is indicated by a grid identifier sequence corresponding to the plural grid points. In some embodiments, the grid identifier is a numerical value or a graphic symbol.

In an embodiment, when a route passes through the current grid point, a black arrow indicates the direction of the route before the route reaches the current grid point, and a white arrow indicates the direction of the route departing from the current grid point. In another embodiment, when a route passes through the current grid point, a hollow dot indicates no logic intersection happens to the current grid point, and a solid dot indicates a logic intersection happens to the current grid point.

Another aspect of the present invention provides an automatic routing method based on directional grid points, which includes the following steps:

creating a grid matrix and initializing grid points and blocks in the grid matrix, so as to set grid identifiers corresponding to the grid points and the blocks respectively;

generating plural heuristic paths by a predetermined routing algorithm;

selecting an optimal path from the plural heuristic paths, where the optimal path has a shortest length and fewest inflection points;

acquiring the grid identifiers corresponding to the grid points on the optimal path and updating the grid matrix according to the acquired grid identifiers; and drawing the optimal path.

In some embodiments, the routing algorithm includes a maze algorithm or a line-exploring method.

In some embodiments, the step of creating the grid matrix and initializing the grid points and blocks in the grid matrix further includes acquiring all grid points in an area enclosed by the blocks and initializing the grid points to realize initialization of the blocks.

In some embodiments, any route in the routing plane is formed by plural grid points connected in sequence and the route is indicated by a grid identifier sequence corresponding to the plural grid points. In some embodiments, the grid identifier is a numerical value or a graphic symbol.

In some embodiments, the optimal path in the step of selecting an optimal path from the plurality of heuristic paths is a straight line or an inflection line.

In some embodiments, the method is applicable to a CFC (Continuous Function Chart) programming environment.

In the application of the routing storage structure based on directional grid points and the routing method thereof of the present invention, the grid matrix stores all grid points enclosed by the obstacle region in the routing plane and the grid identifiers corresponding to the grid points that each route passes through, thereby quickly determining whether the current grid point belongs to the block or the route. If it is determined that the current grid point belongs to the route, the direction of the route that passes through the grid points can be determined. In comparison with the prior art, the routing storage structure of the present invention indicates the route information and block information in the routing plane in the form of grid identifiers corresponding to the grid points without using the line linked list and the block linked list, so that the complexity of the block set does not influence the routing speed, thereby improving the routing efficiency of the automatic routing system.

BRIEF DESCRIPTION OF THE DRAWINGS

Various aspects of the invention can be more clearly understood after reading the following specific embodiments of the embodiment, with reference to the accompanying drawings. In the drawings.

DETAILED DESCRIPTION

Figure 1:
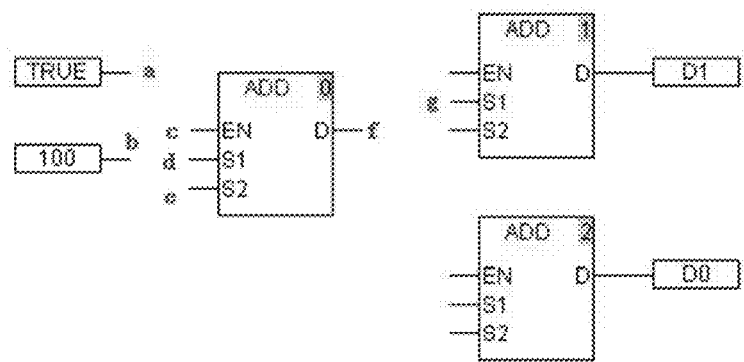
FIG. 1 is a schematic view of a routing plane having blocks for performing an automatic routing operation in a computer automatic routing system.

In order to make the description of the present invention more detailed and more comprehensive, various embodiments of the invention are described below with reference to the accompanying drawings. The same reference numbers are used in the drawings to refer to the same or like elements. However, the embodiments are not intended to limit the present invention. Moreover, it is not intended for the description of operation to limit the order of implementation. Any device with equivalent functions that is produced from a structure formed by a recombination of elements shall fall within the scope of the present invention. Furthermore, the drawings are only illustrative and are not drawn to actual size.

The implementations of the present invention are illustrated in detail below with reference to the accompanying drawings.

Figure 2:
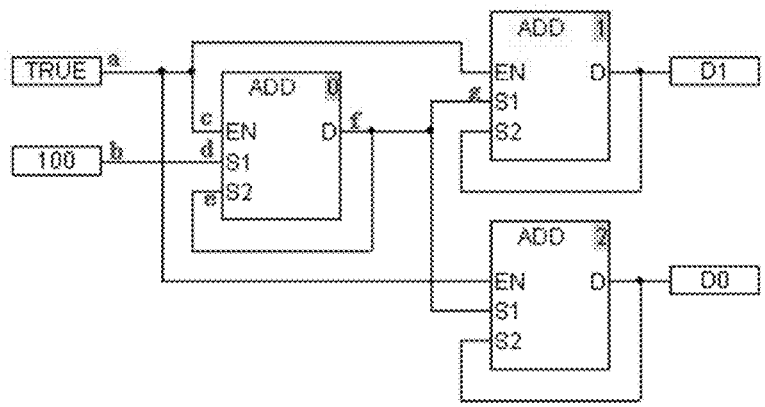
FIG. 2 is a schematic circuit connection diagram of the routing plane in FIG. 1 after the automatic routing operation has been performed.

FIG. 1 is a schematic view of a routing plane having blocks for performing an automatic routing operation in a computer automatic routing system, and FIG. 2 is a schematic circuit connection diagram of the routing plane in FIG. 1 after the automatic routing operation has been performed.

The computer automatic routing system may be used for fabricating a PCB (Printed Circuit Board) and then generating a control circuit with a corresponding function according to the PCB. Hence, the computer automatic routing system may also be referred to as a PCB automatic routing system. The automatic routing system may comprise an automatic routing module. Referring to FIG. 1, the automatic routing may be accomplished in a routing plane. The routing plane is composed of one or more blocks and several point pairs connected with each other. For example, the routing plane includes blocks ADD0, ADD1 and ADD2, input frames TRUE and 100, and output frames D1 and D0. Furthermore, the point pairs connected with each other include terminal a of the input frame TRUE and enable terminal c of ADD0, terminal b of the input frame 100 and selecting terminal d of ADD0, output terminal f of ADD0, terminal g of ADD1, and the like. The routing plane is divided into a routing region and a non-routing region. The routing region includes a "blank" region and an obstacle region that meets the routing condition, and the non-routing region includes an obstacle region that does not meet the routing condition. The obstacle region is constituted by blocks and lines that do not meet the routing condition, and all the obstacle regions in the routing plane constitute an obstacle set. The connecting path between any two connected point pairs in the routing plane is accomplished by the routing algorithm.

During the automatic routing, the obstacle set and the connection relation of the point pairs in the routing plane are first read out and sent to the routing storage structure. Subsequently, all the obstacle set and the connected point pairs are considered and analyzed overall to determine the routing sequence of point pairs. The routing sequence of the point pairs directly influences a routing rate of the automatic routing system. Next, each point pair is automatically routed in sequence according to the provided routing sequence of point pairs, so as to determine each connection path between point pairs. In this process, the routing algorithm needs to frequently access the routing storage structure. Finally, a drawing module charts the obstacle set and the path of point pairs, thereby obtaining the circuit diagram as shown in FIG. 2.

In the automatic routing system of the prior art, with the continuous adding of novel control functions and the continuous generating of novel routing, the obstacle in the routing plane is abruptly increased and becomes quite complicated, and the storage space for storing the function blocks and the routes is expanded. Since the obstacle set information and the routing information (such as the block linked list and the line linked list) in the routing system are both stored in the routing storage structure, the complicated obstacle set inevitably results in a complicated routing storage structure, which in turn results in a decrease in routing speed and a reduction in routing efficiency.

Figure 3:
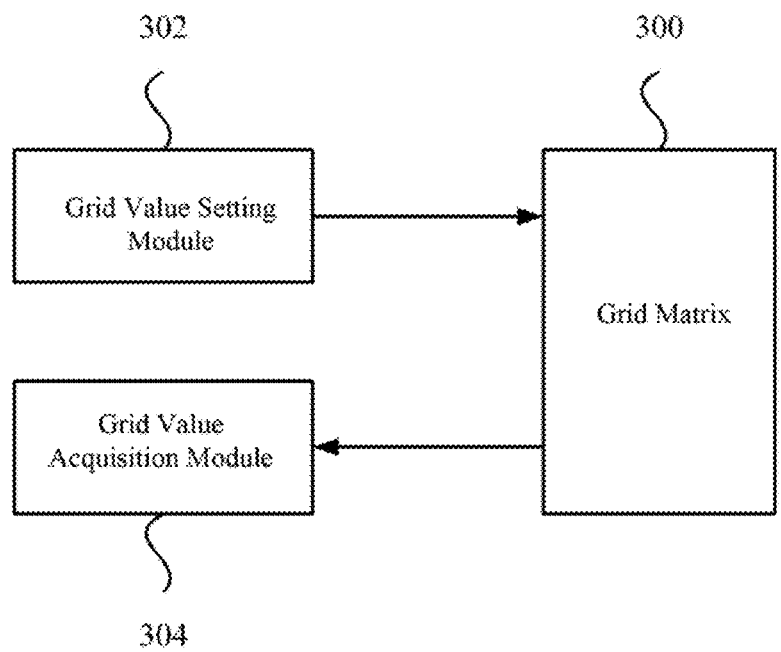
FIG. 3 is a block diagram of a routing storage structure based on directional grid points according to an aspect of the present invention.

To solve the above prior art disadvantages, FIG. 3 is a block diagram of a routing storage structure based on directional grid points according to an aspect of the present invention. Referring to FIG. 3, the routing storage structure of the present invention includes a grid matrix 300, a grid value setting module 302 and a grid value acquisition module 304. Particularly, the grid matrix 300 has N×M grid points, and the grid matrix 300 is used for storing a grid identifier corresponding to each grid point, where both N and M are natural numbers. The grid value setting module 302 sets the grid points contained by the blocks in the routing plane and/or the grid points that the routing passes through as corresponding grid identifiers in accordance with a predetermined setting rule. The grid value acquisition module 304 acquires the grid identifier corresponding to the current grid point from the grid matrix during a routing operation.

In a specific embodiment, the automatic routing system first initializes the grid points contained by all the blocks in the routing plane to the grid identifier corresponding to each grid point. Next, the grid identifiers are stored in the grid matrix 300. For example, the grid matrix 300 includes coordinate positions of the grid points on the routing plane and the grid identifiers corresponding to the grid points. When the grid value acquisition module 304 selects any current grid point during the routing operation, the grid identifier corresponding to the current grid point can be acquired by invoking the grid matrix 300. Also for example, the routing plane is divided into several sub-matrixes in advance and each sub-matrix corresponds to plural grid points, so that the grid matrix 300 can just store the relevant information of the sub-matrixes, and then the sub-matrixes direct to plural specific grid points, thereby saving the storage space occupied by the grid matrix 300.

In another specific embodiment, the routing storage structure further includes a determining module (not shown). The determining module determines whether the routing is able to pass through the current grid point according to the grid identifier corresponding to the current grid point. Particularly, after the grid value acquisition module 304 acquires the grid identifier corresponding to the current grid point, the determining module can determine whether the routing is able to pass through the current grid point according to a physical meaning of the grid identifier. For example, when the current grid point is a grid point enclosed by the blocks, the routing is not able to pass through the current grid point and establish the connection path. When the current grid point is the blank point, the routing is able to pass through the current grid point and establish the connection path.

In still another specific embodiment, the routing storage structure further includes an update module (not shown). The update module is disposed between the grid value setting module 302 and the grid matrix 300, and receives the grid identifiers set by the grid value setting module 302 and updating the grid identifiers to the grid matrix 300. For example, when the routing plane is in a pre-routing state, the grid value setting module 302 initializes all the contained grid points and sends the grid identifiers with different physical meanings to different grid points. Thereafter, the routing operation starts in the routing plane. After the routing operation has been performed, it should be evident that the finished connection path includes plural grid points, and the grid identifier corresponding to each grid point in the initialization state is changed into another current grid identifier. For example, on the connection path for transferring signals from left to right in a horizontal direction, the grid points in which the grid identifiers thereof are blank points have become new grid identifiers (such as, the numerical value 18, the graphic symbol that the black arrow enters and the white arrow comes out). At this time, the grid value setting module 302 needs to reset the grid identifiers corresponding to the grid points and update the reset grid identifiers to the grid matrix 300, so that the grid matrix 300 is maintained having the grid points in the latest state and the mapping relation of the grid identifiers of the grid points in each routing cycle (for example, one connection path between point pairs is established).

Figure 4:
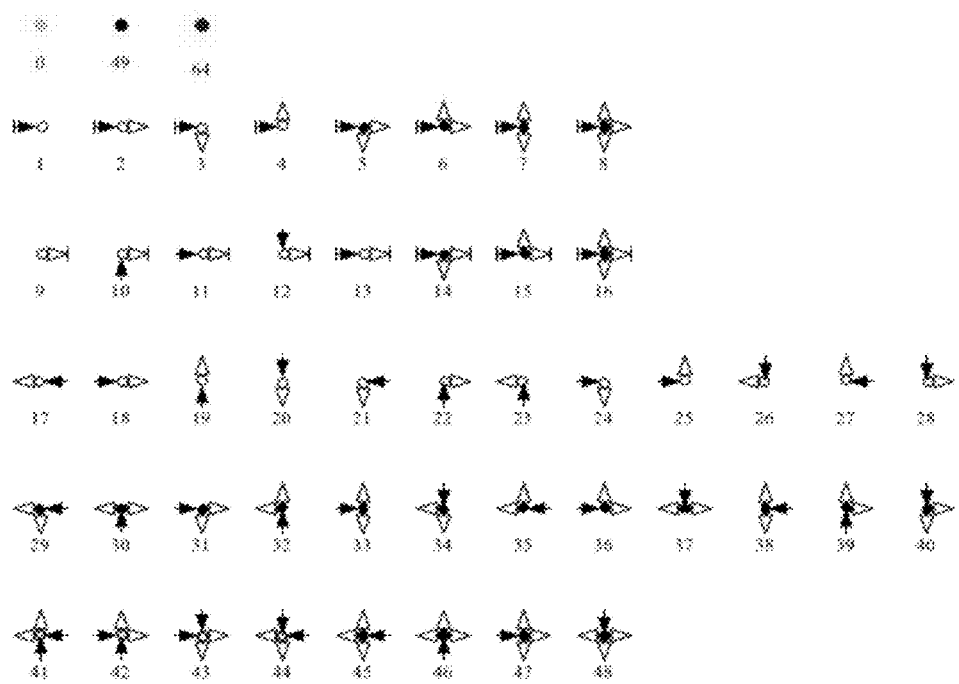
FIG. 4 is a schematic view of grid identifiers for different grid points in the routing storage structure in FIG. 3.

FIG. 4 is a schematic view of grid identifiers for different grid points in the routing storage structure in FIG. 3. Those skilled in the art should understand that the manner of indication of the grid identifiers in FIG. 4 is illustrative, and other ways to provide an indication of the grid identifiers fall within the scope of the present invention. In this example, the boundary grid points of the routing plane are indicated by the numerical value 64 or colored solid dots. The blank grid points are indicated by the numerical value 0 or hollow circles. The grid points enclosed by the blocks are indicated by the numerical value 49 or black solid dots. The numerical value 17 indicates the route that passes through the grid points is from left to right. That is, the route enters the grid points from the left side thereof and comes out of the grid points from the right side thereof.

In a specific embodiment, any route in the routing plane is formed by plural grid points connected in sequence, and the route is indicated by a grid identifier sequence corresponding to the plural grid points. For example, the route for transferring signals from left to right in a horizontal direction includes 5 grid points, and the route may be represented as 17-17-17-17-17. It is evident from the above description that in addition to being indicated by the numerical values, the grid identifiers corresponding to the grid points may also be indicated by graphic symbols. When a graphic symbol is used to represent the route information of the route passing through the grid points, a black arrow indicates the direction of the route before the route reaches the current grid point, and a white arrow indicates the direction of the route departing from the current grid point. Furthermore, for representing the route information of the route passing through the grid points, a hollow dot indicates that no logic intersection happens to the current grid point, and a solid dot indicates that a logic intersection happens to the current grid point.

Figure 5:
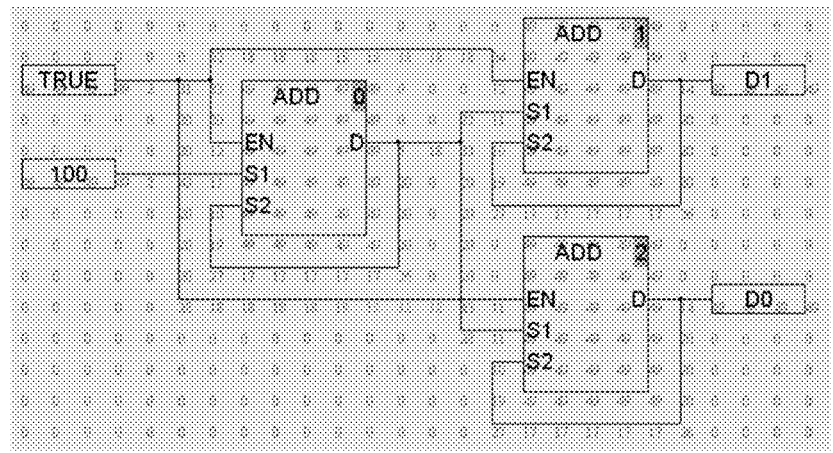
FIG. 5 is a schematic state view of the routing plane indicated by numerical values after the automatic routing has been performed by the routing storage structure in FIG. 3.

FIG. 5 is a schematic state view of the routing plane indicated by numerical values after the automatic routing has been performed by the routing storage structure in FIG. 3. Referring to FIGS. 4 and 5, taking the route between the port S2 and port D of ADD0 as an example, the specific path corresponding to the route is represented as the numerical values 49-5-20-20-20-26-17-17-17-17-17-27-19-10-49. According to the physical meanings corresponding to the numerical values, the routing path conveys the following information. The routing path starts from the port D of the block ADD0, passes through a grid point (marked by the numerical value 5), and the signals of the grid points enter from the left side and come out from the right side and bottom side of the grid points respectively. After that, the routing path sequentially passes 3 grid points (marked by the numerical value 20) and 1 grid point (marked by the numerical value 26), where 20 indicates the vertical direction of the route from top to bottom and 26 indicates that the route enters from the top side of the grid points and comes out from the left side thereof along the vertical direction. Thereafter, the route sequentially passes through 5 grid points (marked by the numerical value 17) and 1 grid point (marked by the numerical value 27), where 17 indicates the horizontal direction of the route from right to left, and 27 indicates that the route enters from the right side of the grid points and comes out from the top side along the horizontal direction. Finally, the route passes through the grid points (marked by the numerical value 19)

and the grid points (marked by the numerical value 10) and reaches the port S2, where 19 indicates the vertical direction of the route from bottom to top and 10 indicates that the route enters from the bottom side of the grid points and comes out from the right side along the vertical direction.

Figure 6:
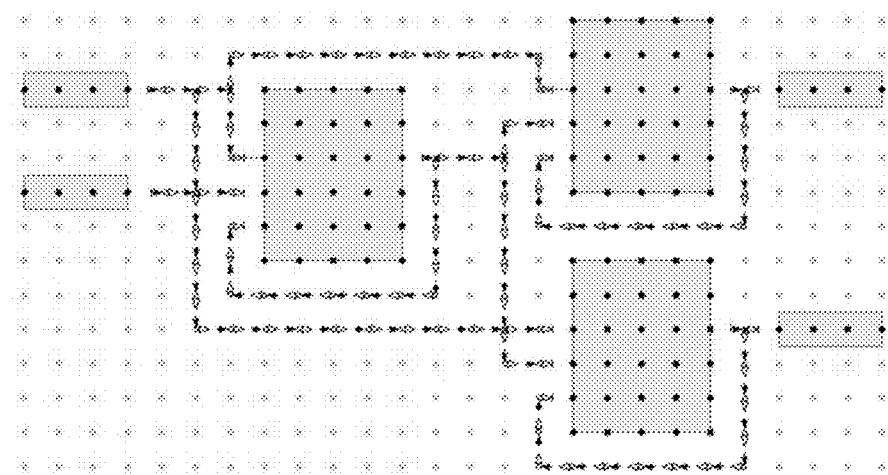
FIG. 6 is a schematic state view of the routing plane indicated by graphic symbols after the automatic routing has been performed by the routing storage structure in FIG. 3.

FIG. 6 is a schematic state view of the routing plane indicated by graphic symbols after the automatic routing has been performed by the routing storage structure in FIG. 3. Referring to FIGS. 4 and 6, likewise, taking the route between the port S2 and the port D of ADD0 as an example, the route can be indicated by a graphic symbol sequence, and the direction of the route is described as follows. The route starts from port D, continues to horizontally pass through one grid point (corresponding to 1 grid point marked by the numerical value 5 in FIG. 5) rightwards. Next, the route passes through 4 grid points (corresponding to 3 grid points marked by the numerical value 20 in FIG. 5 and 1 grid point marked by the numerical value 26) vertically downwards. After that, the route continues to horizontally pass through 6 grid points (corresponding to 5 grid points marked by the numerical value 17 in FIG. 5 and 1 grid point marked by the numerical value 27) leftwards, and then vertically pass through 2 grid points (corresponding to 1 grid point marked by the numerical value 19 in FIG. 5 and 1 grid point marked by the numerical value 10) upwards. Finally, the route continues to horizontally reach port S2 rightwards. The directional grid points in the routing plane when marked by the graphic symbols enable the intuitive understanding of the direction of the route in the circuit.

Figure 7:
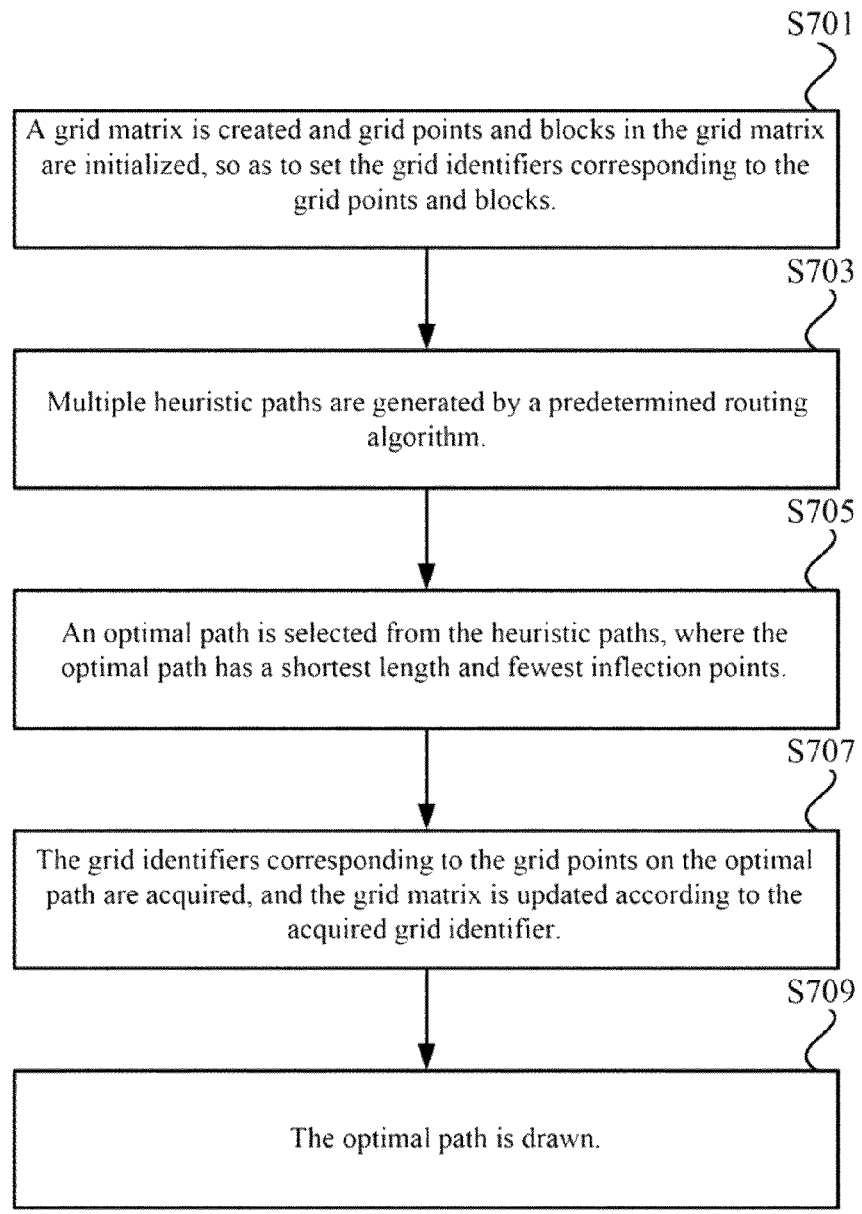
FIG. 7 is a flow chart of an automatic routing method based on directional grid points according to an aspect of the present invention.

FIG. 7 is a flow chart of an automatic routing method based on directional grid points according to an aspect of the present invention. In an embodiment, the automatic routing method is applicable to the CFC programming environment. Referring to FIG. 7, in the automatic routing method, first in step S701, a grid matrix is created, and grid points and blocks in the grid matrix are initialized, so as to set the grid identifiers corresponding to the grid points and blocks. Next, in step S703, plural heuristic paths are generated by a predetermined routing algorithm. All the heuristic paths can route the path between the connected point pairs, but some paths probably are not optimal. For example, a straight line may be used for the route originally, but the heuristic path needs plural inflection lines to achieve the same connection purpose. In some embodiments, the routing algorithm includes a maze algorithm or a line-exploring method.

Subsequently, in step S705, an optimal path is selected from the heuristic paths. The optimal path has a shortest length and fewest inflection points. In some embodiments, the optimal path is a straight line or an inflection line. In step S707, the grid identifiers corresponding to the grid points on the optimal path are acquired, and the grid matrix is updated according to the acquired grid identifiers. In step S709, the optimal path is drawn on, for example, a display screen of a computer.

In a specific embodiment, the step of creating a grid matrix and initializing grid points and blocks in the grid matrix further includes acquiring all the grid points in an area enclosed by the blocks and initializing the grid points to realize initialization of the blocks.

In another specific embodiment, any route in the routing plane is formed by plural grid points connected in sequence, and the route is indicated by the grid identifier sequence corresponding to the plural grid points. For example, the grid identifier is the numerical value or the graphic symbol.

In the application of the routing storage structure based on directional grid points and the routing method thereof of the present invention, the grid matrix stores all grid points enclosed by the blocks in the routing plane and the grid identifiers corresponding to the grid points that each route passes through, thereby quickly determining whether the current grid point belongs to the block or the route. If it is determined that the current grid point belongs to the route, the direction of the route that passes through the grid points can be determined. In comparison with the prior art, the routing storage structure of the present invention indicates the route information and block information in the routing plane in the form of grid identifiers corresponding to the grid points without using the line linked list and the block linked list, so that the complexity of the block set does not influence the routing speed, thereby improving the routing efficiency of the automatic routing system.

Although the implementations of the present invention have been described with reference to the accompanying drawings, it will be understood by those of ordinary skill in the art that various modifications and variations can be made without departing from the scope and spirit of the present invention. Therefore, the modifications and variations shall fall within the scope defined by the appended claims.

What is claimed is:

1. A routing storage structure based on directional grid points installed on a computer and help a user to compile a program which will be downloaded to PLC from the computer, when the computer performs the routing storage structure, the user need to provide information of blocks and points of the blocks need to be connected in a plane, the routing storage structure comprising:

a grid matrix generation module for transforming the plane full of blocks with points need to be connected into a grid matrix, wherein the grid matrix having N×M grid points for storing a grid identifier corresponding to each grid point, wherein both N and M are natural numbers;

a grid value acquisition module for acquiring the grid identifier corresponding to the current grid point from the grid matrix during a routing operation; and a grid value setting module for setting at least one of the grid points contained by the blocks in the routing plane and/or the grid points that the routing passes through as corresponding grid identifiers in accordance with a predetermined setting rule;

a determining module for determining whether the router is able to pass through the current grid point according to the grid identifier corresponding to the current grid point;

a selecting module for selecting an optimal path from a plurality of heuristic paths, wherein the optimal path has a shortest length and fewest inflection points; and an update module for updating the grid matrix according to the grid identifier set by the grid value setting module.

2. The routing storage structure installed on a computer of claim 1 wherein the grid matrix comprises n×m sub-matrixes, and each sub-matrix corresponds to k×k grid points, wherein n, m and k are natural numbers.

3. The routing storage structure installed on a computer of claim 1, wherein any route in the routing plane is formed by a plurality of grid points connected in sequence, and the route is indicated by a grid identifier sequence corresponding to the plurality of grid points.

4. The routing storage structure installed on a computer of claim 3, wherein the grid identifier is a numerical value or a graphic symbol.

5. The routing storage structure installed on a computer of claim 4, wherein when a route passes through the current grid point, a black arrow indicates the direction of the route before the route reaches the current grid point, and a white arrow indicates the direction of the route departing from the current grid point.

6. The routing storage structure installed on a computer of claim 4, wherein when a route passes through the current grid point, a hollow dot indicates no logic intersection happens to the current grid point, and a solid dot indicates a logic intersection happens to the current grid point.

7. An automatic routing method based on directional grid points by running a routing storage structure stored on a computer, comprising:

creating a grid matrix for a plane full of blocks with points need to be connected by a grid matrix generation module in the routing storage structure and initializing grid points and blocks in the grid matrix, so as to set grid identifiers corresponding to the grid points and the blocks respectively by the grid matrix, a grid value setting module in the routing storage structure;

generating a plurality of heuristic paths by a determining module based on the grid identifiers corresponding to the grid points in the routing storage structure;

selecting an optimal path from the plurality of heuristic paths by a selecting module, wherein the optimal path has a shortest length and fewest inflection points;

acquiring the grid identifiers corresponding to the grid points on the optimal path and updating the grid matrix according to the acquired grid identifiers; and drawing the optimal path.

8. The automatic routing method based on directional grid points by running a routing storage structure stored on a computer of claim 7, wherein the routing algorithm comprises a maze algorithm or a line-exploring method.

9. The automatic routing method based on direction grid points by running a routing storage structure stored on a computer of claim 7, wherein the step of creating the grid matrix and initializing the grid points and blocks in the grid matrix further comprises:

acquiring all grid points in an area enclosed by the blocks and initializing the grid points to realize initialization of the blocks.

10. The automatic routing method based on directional grid points by running a routing storage structure stored on a computer of claim 7, wherein any route in the routing plane is formed by a plurality of grid points connected in sequence and the route is indicated by a grid identifier sequence corresponding to the plurality of grid points.

11. The automatic routing method based on directional grid points by running a routing storage structure store on a computer of claim 10, wherein the grid identifier is a numerical value or a graphic symbol.

12. The automatic routing method based on directional grid points by running a routing storage structure stored on a computer of claim 10, wherein the optimal path in the step of selecting an optimal path from the plurality of heuristic paths is a straight line or an inflection line.

13. The automatic routing method based on directional grid points by running a routing storage structure store on a computer of claim 10, wherein the method is applicable to a CFC (Continuous Function Chart) programming environment.

* * * * *